(12) United States Patent
Tiwari et al.

(10) Patent No.: US 7,332,978 B2
(45) Date of Patent: Feb. 19, 2008

(54) GLITCH FREE CONTROLLED RING OSCILLATOR AND ASSOCIATED METHODS

(75) Inventors: Naveen Tiwari, Delhi (IN); Balwant Singh, Greater Noida (IN)

(73) Assignee: STMicroelectronics Pvt Ltd., Uttar Pradesh (IN)

( * ) Notice: Subject to any disclaimer, the term of this patent is extended or adjusted under 35 U.S.C. 154(b) by 61 days.

(21) Appl. No.: 11/303,344

(22) Filed: Dec. 16, 2005

(65) Prior Publication Data

US 2006/0132246 A1 Jun. 22, 2006

(30) Foreign Application Priority Data

Dec. 16, 2004 (IN) .................. 2509/DEL/2004

(51) Int. Cl.
*H03B 27/00* (2006.01)
(52) U.S. Cl. .................. 331/57; 331/74; 331/49; 327/147; 327/149; 327/261
(58) Field of Classification Search .......... 331/49, 331/57, 74; 327/147, 149, 261
See application file for complete search history.

(56) References Cited

U.S. PATENT DOCUMENTS 5,448,202 A * 9/1995 Owen .................. 329/323

* cited by examiner

*Primary Examiner*—Arnold Kinkead
(74) *Attorney, Agent, or Firm*—Lisa K. Jorgenson; Allen, Dyer, Doppelt, Milbrath & Gilchrist, P.A.

(57) ABSTRACT

A glitch free controlled ring oscillator may comprise a programmable delay chain connected to a gating and inverter stage or means. A latch or latching means may be provided between the delay chain and the gating and inverter stage or means for registering the clock state at the time of disabling the oscillator and setting the output of the oscillator to the registered clock state.

7 Claims, 5 Drawing Sheets

Pulse width depends on ENABLE

Status of CLK_OUT in the end not known

GLITCH FREE CONTROLLED RING OSCILLATOR AND ASSOCIATED METHODS

FIELD OF THE INVENTION

The invention relates to the field of ring oscillators, and, in particular, it relates to a glitch free controlled ring oscillator.

BACKGROUND OF THE INVENTION

Controlled ring oscillators are commonly used for Integrated Circuit (IC) applications where trigger and stop operations of the oscillator are required to be precisely monitored and controlled. FIG. 1 shows a conventional oscillator consisting of a ring of delay elements or inverters Td and a final control stage Cs, which enables/disables the ring. The control stage Cs has an inverter Tiv and a logic gate Tand.

The logic gate Tand receives the output of the inverter Tiv, an enabling/disabling signal ENABLE, and provides a clock output CLK_OUT. When the ring is enabled by the ENABLE signal, the CLK_OUT has an oscillating waveform. Thus the conventional circuit acts as a trigger start oscillator with a frequency $F_{clk}=(1/(T_{Td}+T_{Tiv}+T_{Tand})*2)$, where $T_{Td}$, $T_{Tiv}$, $T_{Tand}$ are the delays. This type of oscillator produces glitches when disabled, which is a major problem.

The waveform in FIG. 2 shows an output of the conventional oscillator between two disable signals. When the ENABLE signal is set to disable the oscillator, the CLK_OUT goes to '0' irrespective of the present value, which creates a problem of a minimum pulse width violation for the next stage, or results in a glitch that can have adverse effects on the next stage. This would generate an error of the order of ~(1/Fclk) for a synchronous system. Further, the size of this glitch or pulse can vary at different process and voltage corners.

Thus, conventional methods not only have errors with regards to the output clock, but it is also difficult to estimate the error as the error has large process, voltage, and temperature dependence. This is very critical, particularly for on-chip integrated circuits where an accuracy of few picoseconds is desired and it is expected that the design should have minimal impact of process, voltage, and temperature variations.

SUMMARY OF THE INVENTION

It therefore is an object of the invention to address the above and other limitations associated with the prior art.

The invention may provide a reduced glitch or glitch free controlled ring oscillator, with a feature where it latches the final output value at the point when the ring oscillator is disabled to avoid a minimum pulse width violation for the next stage. The controlled ring oscillator may be used for phase locking.

The controlled ring oscillator may comprise a programmable delay chain connected to a gating and inverter stage or means wherein a latch or latching means is provided between the delay chain and the gating and inverter stage or means. The latch or latching means and the gating and inverter stage or means are connected to a control signal for enabling/disabling the ring oscillator, for registering a clock state at the time of disabling the oscillator and setting the output of the oscillator to the registered clock state.

The glitch free controlled ring oscillator further comprises a pulling down circuit connected to the gating and inverter stage or means for pulling down the registered clock state, if the clock state is high after a period sufficient enough to avoid a false edge or a glitch. The latch or latching means comprises a first and second latch connected in parallel and providing their outputs to a multiplexer, a select line of the multiplexer and an enabling/disabling line of the second latch that is connected to the control signal of the ring oscillator such that the control signal disables the second latch to register a clock at the time of disabling the oscillator and simultaneously selecting the output of the second latch to propagate through the multiplexer. The gating and inverter stage or means comprises an inverter and logic gate connected in series such that the logic gate receives its one input as the control signal of the oscillator.

The ring oscillator may also provide a programmable delay chain connected to the gating and inverter stage or means is provided between the delay chain and the gating and inverter stage or means. The latch or latching means and the gating and inverter stage or means are connected to a control signal for enabling/disabling the ring oscillator. The control signal is received from a control block having a logic gate and a matching delay for registering a clock state at the time of disabling the oscillator and setting the output of the oscillator to the registered clock state, and a pulling down circuit having another programmable delay and logic gates for generating a clock and logic gates connected to the gating and inverter stage or means for pulling down the registered clock state, if the clock state is high after a period sufficient enough to avoid a false edge or a glitch.

A method aspect of the invention is directed to providing a reduced glitch or glitch free controlled ring oscillator. The method may comprise propagating a signal to generate a clock through a programmable delay chain of the oscillator, and registering a clock state at the time of disabling the oscillator and setting the output of the oscillator to the clock state for providing a reduced glitch or glitch free controlled oscillator. The method may further comprise pulling down output of the oscillator if the registered clock state is high after a time sufficient enough to avoid a false edge or a glitch.

BRIEF DESCRIPTION OF THE DRAWINGS

The invention will now described with reference to accompanying drawings.

DETAILED DESCRIPTION OF THE PREFERRED EMBODIMENTS

Figure 1:
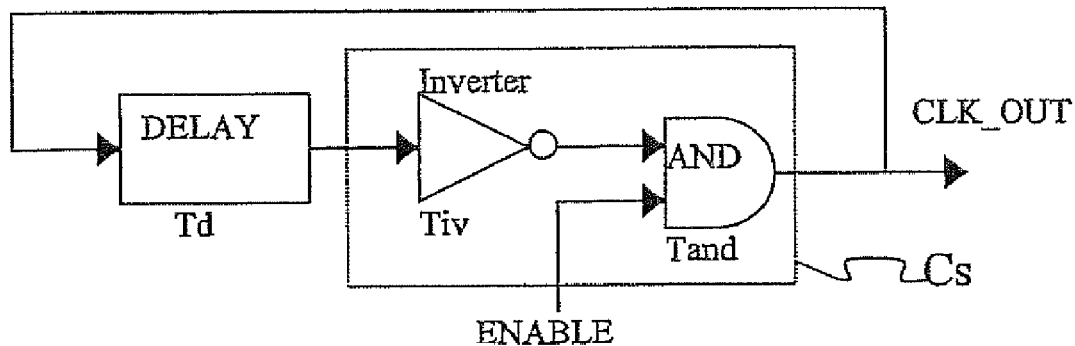
FIG. 1 shows a prior art conventional ring oscillator.
Figure 2:
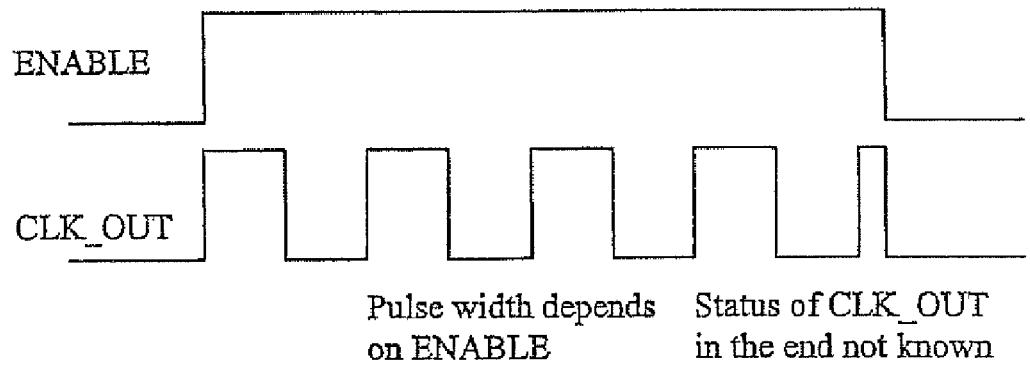
FIG. 2 shows waveforms of the conventional ring oscillator of FIG. 1.
Figure 3:
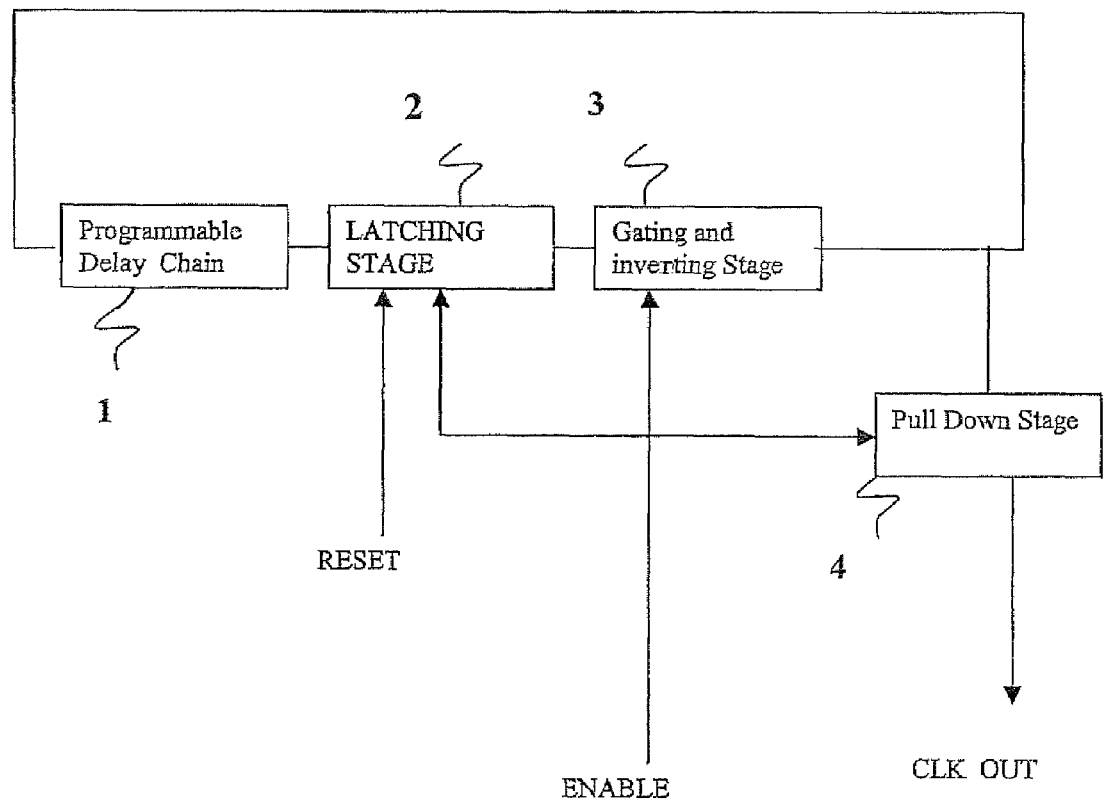
FIG. 3 shows a controlled ring oscillator according to present invention.

FIG. 3 shows a controlled ring oscillator according to present invention. The ring oscillator may comprise a programmable delay chain 1 connected to a gating and inverting stage 3 through a latching stage 2. The latching stage 2 and the gating and inverting stage 3 are connected to a control signal ENABLE for enabling/disabling the ring oscillator.

When the control signal ENABLE disables the ring oscillator, the latching stage 2 registers the clock state and sets the output of the oscillator to the registered clock state thereby avoiding any glitch or undesired edge. Further, the controlled ring oscillator also comprises a pulling down stage 4 connected to the output of the gating and inverting stage 3 for pulling down the registered clock state, if the clock state is high, after a period sufficient enough to avoid a false edge or a glitch.

Figure 4:
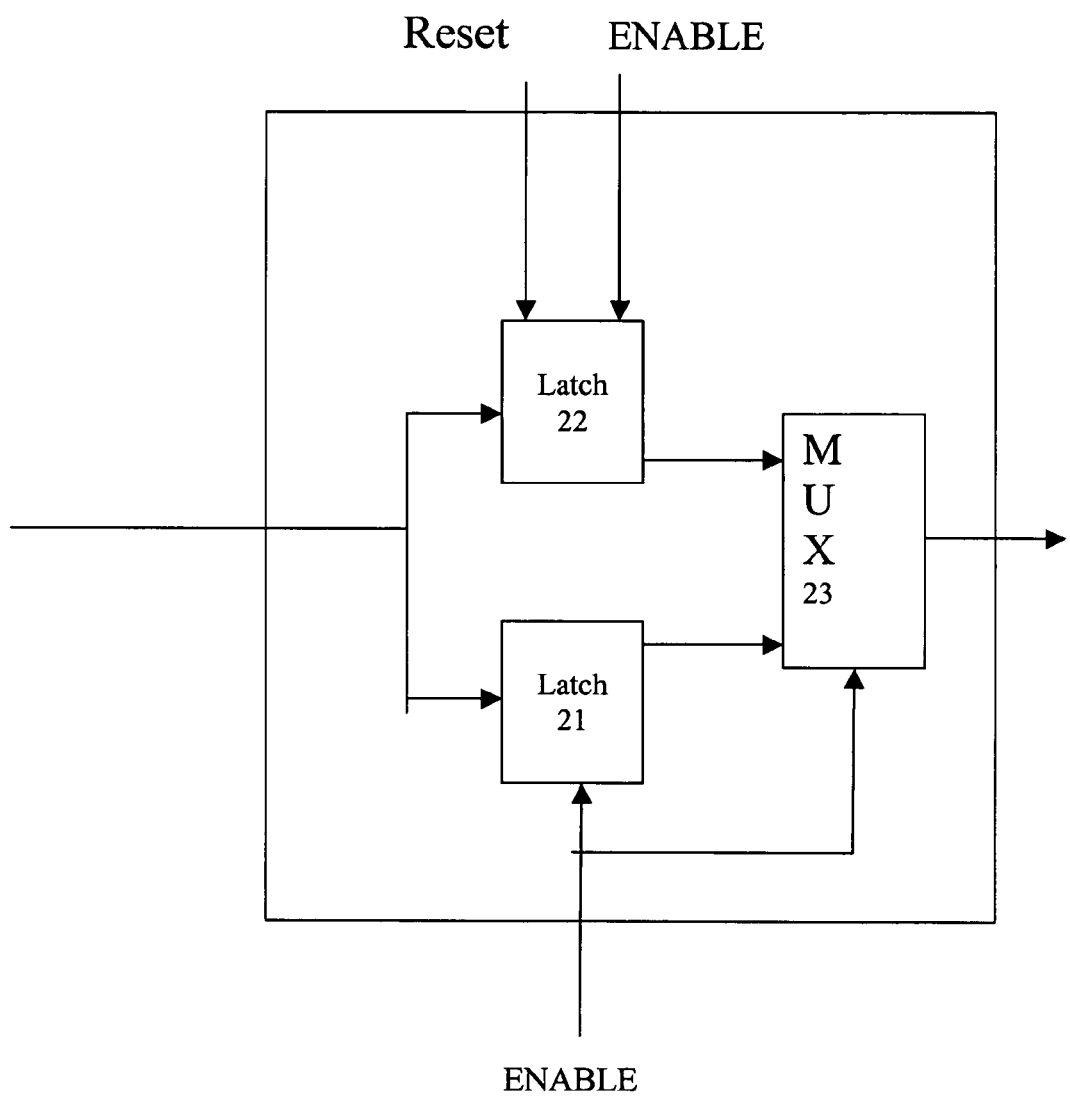
FIG. 4 shows a detailed diagram of the latching stage or FIG. 3.

FIG. 4 is a detailed diagram of the latching stage 2. The latching stage 2 comprises a first latch 21 and a second latch 22 both receiving inputs from the programmable delay chain and providing their outputs to a multiplexer 23, a select line of the multiplexer and enabling/disabling line of the second latch is connected to the control signal ENABLE of the ring oscillator such that the control signal ENABLE disables the second latch to register a clock at the time of disabling the oscillator and simultaneously selecting the output of the second latch to propagate through the multiplexer. The ring oscillator is trigger started when ENABLE=1, and is trigger stopped when ENABLE=0. The RESET=0 resets the ring oscillator CLK_OUT logic value "0".

Figure 5:
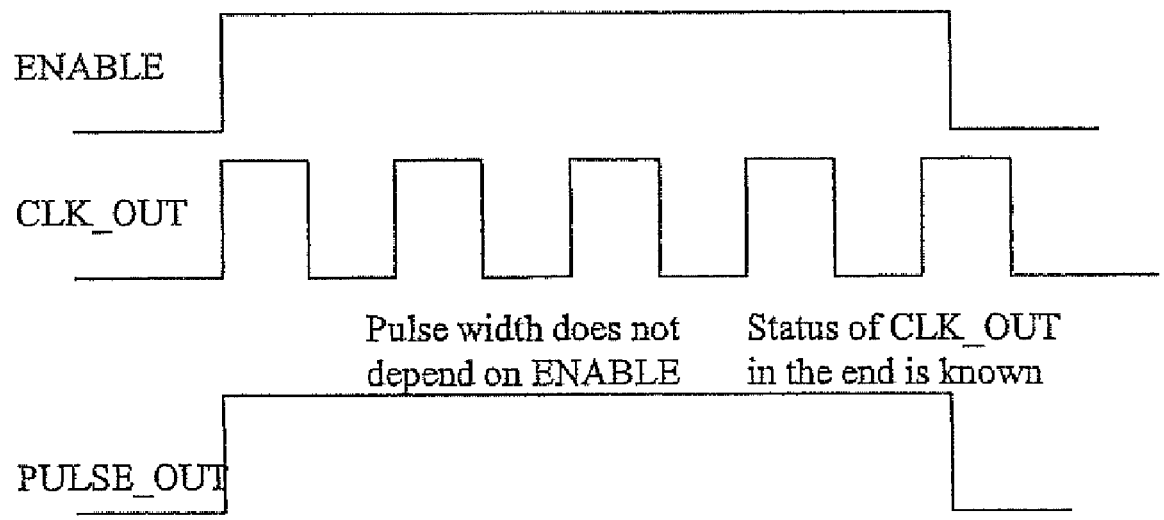
FIG. 5 shows the waveforms of the controlled ring oscillator shown in FIG. 3.

FIG. 5 shows an exemplary output waveform of the ring oscillator of the invention, and the operation of the circuit is now described. In the Reset Mode, RESET=0 and results in CLK_OUT with stable logic "0" value at their output.

The Initialization mode is used to setup the design for the triggering mode. This mode follows after the Reset mode. The initialization is done by making RESET go at logic value "1", while the ENABLE pin is at the logic "0" value. In this mode, CLK_OUT output have stable logic value "0" at their output. This is because pin 0 of multiplexers is transparent.

The Trigger Start Mode is enabled as soon as the ENABLE pin goes high with the RESET pin having a stable logic "1" value. In this mode the CLK_OUT are initially at value "0" as pin 0 of the multiplexers are transparent. As soon as the ENABLE goes high, the pin 1 of the multiplexers become transparent. This results in oscillating frequency at CLK_OUT.

The Trigger Stop Mode is enabled as soon as the ENABLE pin goes low (with the RESET pin having a stable logic "1" value). Just before this mode the CLK_OUT sees the frequency of the ring oscillator. As soon as the ENABLE goes low the multiplexers selects the input accordingly. This causes LATCH 21 to latch the value of ring oscillator at that moment. Thus, the CLK_OUT shows the status of the ring oscillator when the trigger stop signal is applied.

The Self Characterize Mode (not shown) can be used to represent the actual time period of the ring oscillator at the output pad of a chip. This value is very useful for on-chip representations of timings. This forces the ring oscillator to start oscillating and the frequency division is performed to achieve a much lower frequency at the output pad. The lower frequency is small enough to be measured at the tester.

Accordingly, the ring oscillator may provide advantages when compared to the existing art such as on-chip trigger start and stop ring oscillator, glitch free output, and area efficient with very small area penalty. In addition, the method may reduce error over a range of process, voltage, and temperature.

Figure 6:
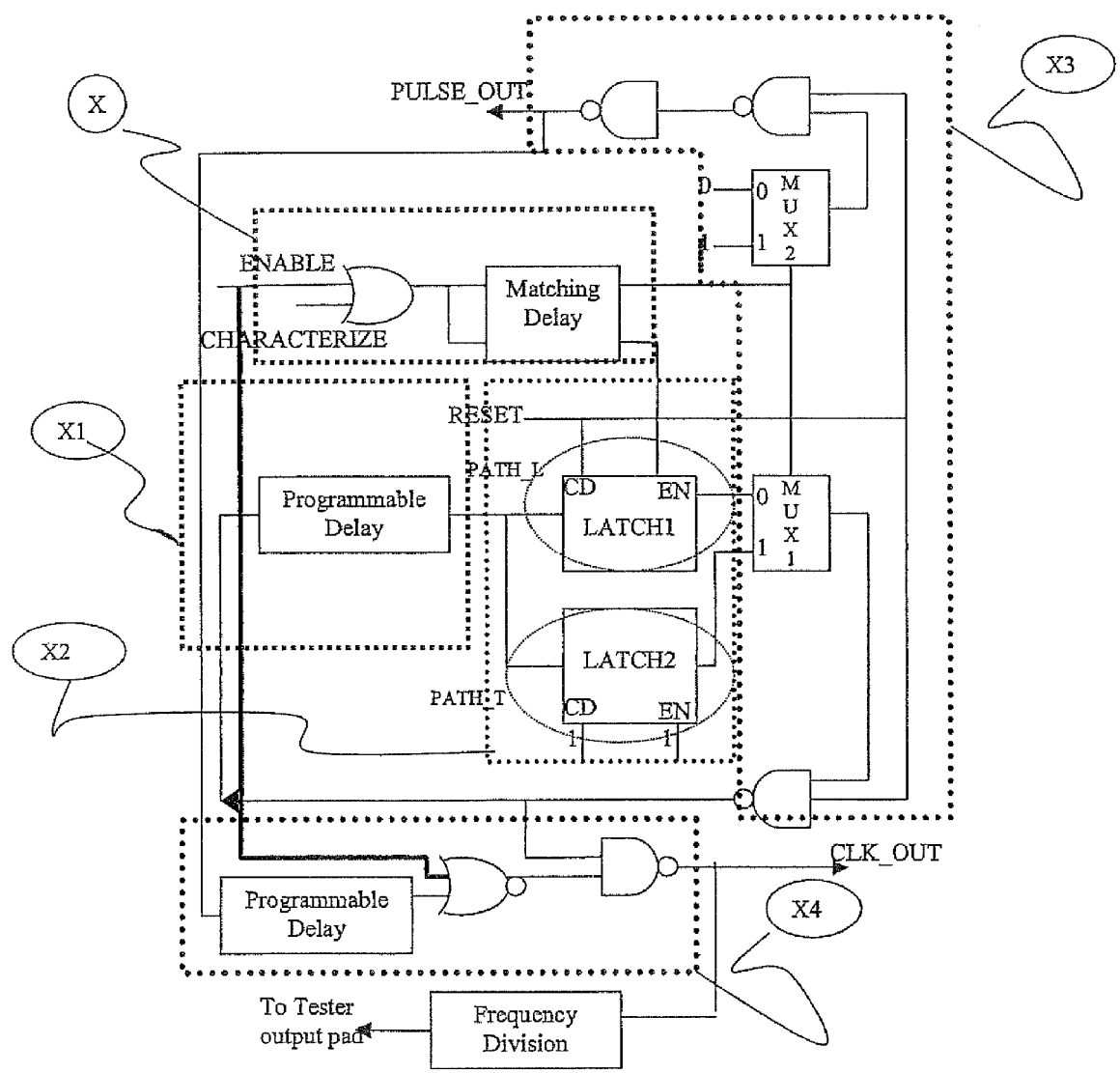
FIG. 6 shows an exemplary embodiment in accordance with the invention.

FIG. 6 shows an exemplary embodiment of the invention. According to this embodiment, the glitch free controlled ring oscillator has a programmable delay chain of a block X1 connected to a LATCH 1 and a LATCH 2 of a Block X2 in parallel providing their outputs to a multiplexer MUX1 of the gating block X3. A select line of the multiplexer MUX1 and an enabling/disabling line of LATCH1 are connected to a controlling block X of the ring oscillator such that the control block disables the LATCH 1 to register a clock at the time of disabling the oscillator and simultaneously selecting the output of the LATCH 2 to propagate through the multiplexer MUX 1. The LATCH 2 and the LATCH 1 are provided between the programmable delay chain and the gating and inverting block X3, the LATCH 2 and the gating and inverting block X3 are connected to a control block X for enabling/disabling the ring oscillator, for registering a clock state at the time of disabling the oscillator and setting the output of the oscillator to the registered clock state. A block X4 is the pulling down circuit connected to the gating and inverting block X3 for pulling down the registered clock state, if the clock state is high after a period sufficient enough to avoid a false edge or a glitch.

The control block X has an AND gate receiving an enable signal and a characterize signal and provides its output to a matching delay circuit for matching delay. The output of the matching delay circuit is used as the control signal from the glitch circuit.

The pulling down circuit X4 has a programmable delay for generating a clock and logic gates for enabling a pull down operation when desired. The generated clock frequency of the logic block can be tested at the output pad as shown.

That which is claimed is:

1. A ring oscillator comprising:
    a gating and inverter stage;
    a programmable delay chain; and
    a latch stage coupled between said programmable delay chain and said gating and inverter stage for registering a clock state at a time of disabling the ring oscillator and setting an output of the ring oscillator to the clock state.

2. The ring oscillator according to claim 1 further comprising a pull down circuit coupled to said gating and inverter stage for pulling down the clock state if the clock state is high after a period sufficient to avoid at least one of a false edge and a glitch.

3. The ring oscillator according to claim 1 wherein said gating and inverter stage further comprises a multiplexer having a select line; wherein said latch stage comprises a first latch and a second latch coupled in parallel for providing their outputs to said multiplexer; wherein the second latch has an enabling/disabling line; and wherein the select line of the multiplexer and the enabling/disabling line of the second latch receive a control signal of the ring oscillator which disables the second latch to register the clock state at a time of disabling of the ring oscillator and simultaneously selecting a second latch output to propagate through said multiplexer.

4. The ring oscillator according to claim 1 wherein said gating and inverting stage comprises an inverter and a logic gate coupled in series; and
    wherein the logic gate receives an input as a control signal of the ring oscillator.

5. A ring oscillator comprising:
    a gating and inverting stage;
    a programmable delay chain;

a latch stage between said programmable delay chain and said gating and inverting stage;

a control block for generating a control signal and comprising a logic gate and a matching delay for registering a clock state at a time of disabling the ring oscillator and setting an output of the ring oscillator to the clock state;

said latch and gating and inverting stage being responsive to the control signal for enabling/disabling the ring oscillator; and a pull down circuit comprising a second programmable delay chain and logic gates for generating the clock state, the logic gates coupled to said gating and inverting stage for pulling down the clock state if the clock state is high after a period sufficient to avoid at least one of a false edge and a glitch.

6. A method for providing a reduced glitch signal output from a ring oscillator, the method comprising:

propagating a signal to generate a clock through a programmable delay chain of the ring oscillator; and registering a clock state at a time of disabling the ring oscillator and setting an output of the ring oscillator to the clock state to provide the reduced glitch signal output.

7. The method according to claim 6 further comprising pulling down output of the ring oscillator if the clock state is high after a time sufficient to avoid at least one of a false edge and a glitch.

* * * * *